United States Patent [19]

Cook

[11] 4,345,967
[45] Aug. 24, 1982

[54] METHOD OF PRODUCING THIN SINGLE-CRYSTAL SHEETS

[76] Inventor: Melvin S. Cook, 43 Westerly Rd., Saddle River, N.J. 07458

[21] Appl. No.: 127,114

[22] Filed: Mar. 4, 1980

[51] Int. Cl.³ .............................................. C30B 33/00
[52] U.S. Cl. .................................... 156/613; 156/624; 156/DIG. 66; 156/DIG. 80; 136/252
[58] Field of Search ....... 156/603, DIG. 88, DIG. 73, 156/600, 624, 621, 609, 610, 612, 613; 264/81; 427/86; 136/89 TF, 89 SG, 258, 261, 252; 148/1.5

[56] References Cited

U.S. PATENT DOCUMENTS

| | | | |
|---|---|---|---|
| 3,370,980 | 2/1968 | Anderson | 156/600 |
| 3,585,088 | 6/1971 | Schwuttke et al. | 156/603 |
| 3,993,533 | 11/1976 | Milnes et al. | 156/624 |
| 4,027,053 | 5/1977 | Lesk | 427/86 |
| 4,116,751 | 9/1978 | Zaromb | 156/600 |

FOREIGN PATENT DOCUMENTS 2109 5/1979 European Pat. Off. ....... 136/89 TF

Primary Examiner—Hiram Bernstein
Attorney, Agent, or Firm—Gottlieb, Rackman & Reisman

[57] ABSTRACT

A method of producing thin single-crystal sheets is disclosed. A thin single-crystal layer is formed on a substrate, with the material of the layer having a different absorption coefficient for laser radiation than does the material of the substrate at their interface. The laser radiation is focused into a region contiguous to the interface and extending the width of the interface, and is swept across the entire interface region. The energy that is absorbed from the laser radiation in the focus region liquifies material in this region. The layer is progressively separated from the substrate as the laser radiation is swept across the interface, until the entire layer is separated from the substrate. The method is applicable to the production of thin single-crystal sheets of semiconductor material which may be used, for example, in the manufacture of solar cells or integrated circuits.

19 Claims, 6 Drawing Figures

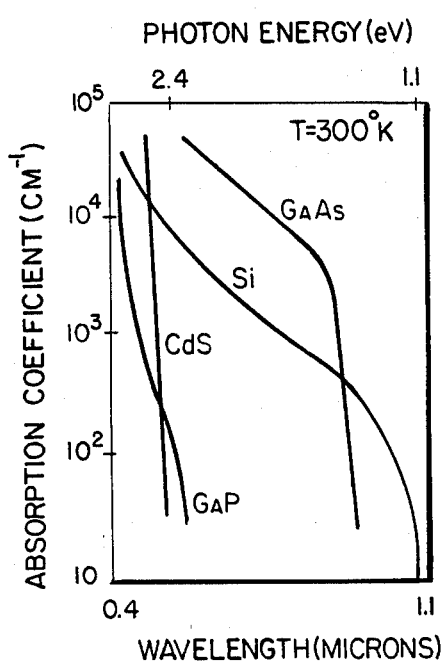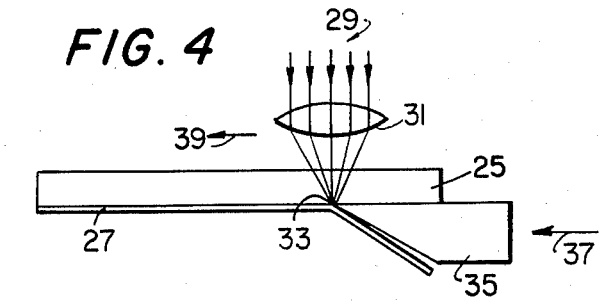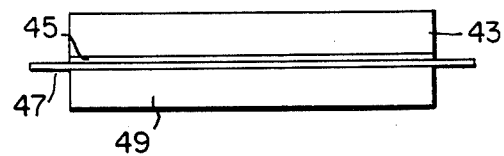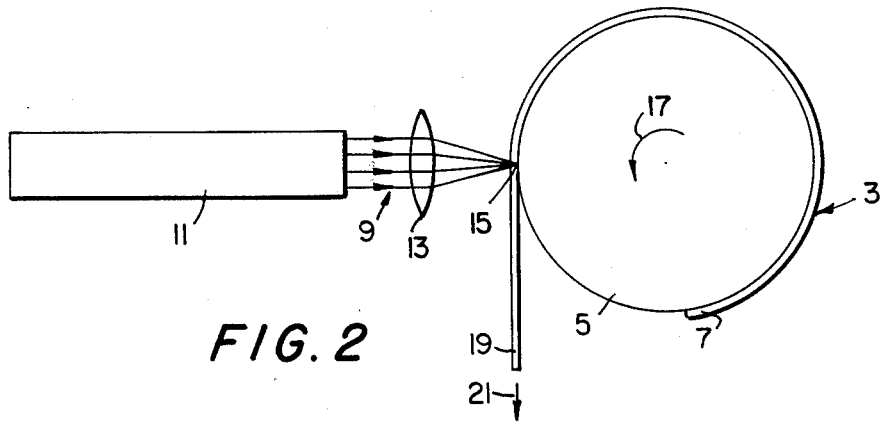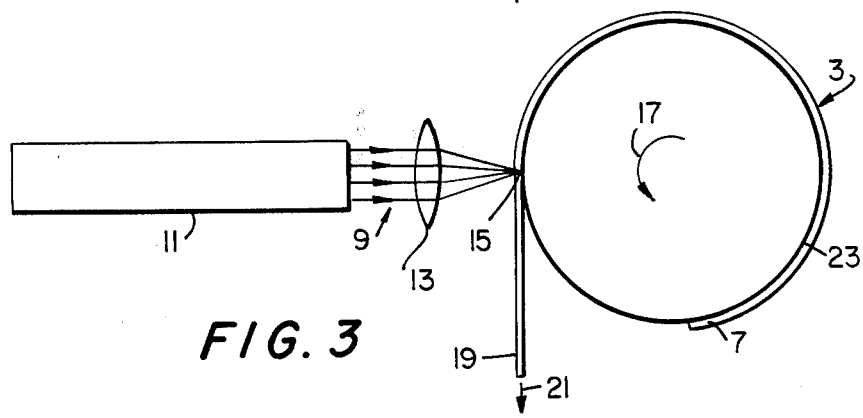

METHOD OF PRODUCING THIN SINGLE-CRYSTAL SHEETS

This invention relates to a low-cost method of producing thin single-crystal sheets. It can be used, for example, to produce thin single-crystal sheets of semiconductor materials for use in the manufacture of solar cells and integrated circuits.

This application is a continuation-in-part of my copending application entitled "METHOD OF PRODUCING THIN CRYSTALS," Ser. No. 112,938, filed on Jan. 17, 1980, now abandoned.

The prior art includes a variety of methods for the production of thin single-crystals. Most commonly, the interest is in the production of thin single-crystal wafers of semiconductor material for use in the electronics industry.

In producing such wafers, the starting point is the preparation of highly-purified materials, which are then used in growing large single-crystals called boules. Growth methods for this purpose include the Bridgeman, Czochralski, and floating-zone methods. The resulting boule is sawed into slices, and the slices are then lapped and polished to obtain a smooth and defect-free surface on which subsequent processing steps are performed. Approximately half of the boule material is lost in making the wafers. Moreover, for reasons of structural integrity in these operations, the wafers are generally far thicker than is necessary functionally for the final product made using the wafers, thereby adding to the cost of the wafers.

Peeled film technology, involving separating a layer of crystal from a substrate, has recently been developed for use in the production of thin-film single-crystals for use in making solar cells, for example. Such techniques were reported in A. G. Milnes and D. L. Feucht, *Proceedings of the 11th I. E. E. E. Photovoltaic Specialist Conference*, pp. 338–341 (1975), and in M. Konagi, M. Sugimoto, and K. Takahashi, *Journal of Crystal Growth*, v. 45, pp. 277–280 (1978). These techniques involve peeling films by melting or dissolving a layer formed intermediate the film and the substrate, the intermediate layer being different in its material composition from the film and the substrate. The techniques described suffer from disadvantages that significantly adversely affect film quality, cost, and obtainable size.

If the technique that involves melting an intermediate layer lower in its melting point temperature than the film or substrate adjacent to it is utilized to peel a film, it is necessary that a liquified layer be generated between the entire film and the substrate from which it is to be removed. To accomplish such a result, the entire structure including film, intermediate layer, and substrate must be heated to a temperature at least equal to the melting point temperature of the intermediate layer, and held at such a temperature until the necessary liquified layer is developed over the entire interface between the film and the substrate, so that when removal of the film is attempted it will be successful and the film will not tear or otherwise be damaged. Particularly for the III-V compounds, the temperatures that must be attained are fairly high. Diffusion of material throughout a crystalline material takes place rapidly at such temperatures. When the liquified material derived from the intermediae layer is held in contact with the film, material from this liquid will enter the film and alloy with it or constitute impurities in it. As the material of the film differs in composition from that of the intermediate layer in order that their melting point temperatures may differ, such diffusing material may lower charge carrier lifetimes and mobilities. This can result in a lowering of the efficiency of a final device made from the film. In addition, it is desirable for certain applications to produce a film having graded impurity distribution. For example, it may be useful to produce a film with a p-n junction already formed in it. The film can be grown in such a form. However, if the film is held at elevated temperatures for a significant interval of time, diffusion processes will tend to even out impurity distributions in it, and thus the efficiency of the p-n junction will be lowered. In general, the larger the product film size, the longer the structure must be held at an elevated temperature in order to assure a liquified layer exists over the entire interface region between the film and the substrate so that successful peeling can be accomplished. Thus, the diffusion problem becomes more serious for the larger film product sizes than for the small sizes. Since it is more cost-effective to use the larger film size material in manufacturing solar cells, the cost of such a product using the prior art described above is negatively impacted by limitations on product film size. As it is precisely the cost of solar cells that limits their use, this is a serious disadvantage of the prior art in terms of this final product application.

There exists another difficulty with this prior art. In order to grow a single-crystal layer over a single-crystal surface, the lattice parameters must be very-well matched and the two materials must be isomorphic. However, if the two materials are taken over a wide excursion of temperatures, then their coefficients of thermal expansion must also be very-well matched. It is rarely possible to achieve this latter matching. Therefore, if the temperature excursion is wide, strains, dislocations, and defects will tend to appear in the product film as a result. The necessity of bringing the structure (including film, intermediate layer, and substrate) to the melting point temperature of the intermediate layer and hold it there for some time has the negative effect of tending to cause defects of various types in the product film.

The other prior art technique referred to above involves dissolving away an intermediate layer formed between the substrate and the film. It is clear that significant problems in producing larger size film product exist with this art. Diffusion of materials to and from the intermediate layer through the very narrow channels dissolved away between the film and the substrate during the process is inherently a very slow process—much more so for the larger film sizes. The slowness of the process makes it costly. In addition, the film cannot be expected to be completely inert to the chemicals eating away the intermediate layer, and such materials may also introduce undesirable impurities into the film.

In addition, both of the prior art processes in question require the formation of an intermediate layer between the film and the substrate. Forming such an intermediate layer adds to system complexity and to the cost of the product film.

It is an object of my invention to provide a low-cost method of producing thin sheets of semiconductor and other materials.

It is a further object of my invention to provide a low-cost method of producing thin sheets of single-crystal semiconductor and other materials.

It is a further object of my invention to provide a low-cost method of producing large sheets of thin-film single-crystal semiconductor and other materials.

Briefly, in accordance with the principles of my invention and in the preferred embodiment thereof, a single-crystal layer is grown on a single-crystal substrate surface. Techniques for such growth are well-known in the art, both epitaxial and heteroepitaxial, and include, for example, vapor epitaxial methods, liquid epitaxial methods, growth from a melt, and deposition by molecular beams.

The substrate material is highly absorptive of laser radiation to which the film material is transmissive in this embodiment of my invention. In the case of semiconductor materials, this means that the band-gap energy of the film is greater than the photon energy characterizing the laser radiation, while the band-gap energy of the substrate is less than this photon energy.

If the substrate has been grown in the form of a large cylindrical boule, it is first shaped into a geometrically true cylinder. A single-crystal layer is then grown onto the cylindrical surface of this substrate, except for a bare linear region running parallel to the cylinder axis which will later be the region where peeling is commenced.

Laser radiation is then focused into a substrate region adjacent the crystal layer. The focus region extends the full length of the layer parallel to the cylinder axis. The optical system employed to achieve this also produces a uniform radiation distribution in the focus region, and thus a uniform effect in this region. The laser radiation is initially directed adjacent an edge of the layer on the substrate where film peeling can commence.

Since the substrate material absorbs laser radiation while the layer material is transparent to it, the substrate will be directly heated by the absorbed radiation whereas the layer will be heated only by transfer of heat from the substrate (as a result of such radiation). However, only a portion of the heat developed will transfer to the layer. Thus, the heating effect due to the radiation will be significantly less in the layer than in the substrate. For this reason, substrate material in the focus region can be liquified while adjacent layer material remains solid—even if the layer material has a lower melting point temperature than that of the substrate material.

In the present embodiment of the invention, liquification of substrate material in the focus region occurs as the cylinder rotates under the (fixed) optical system, and separation of the layer from the substrate is mechanically performed while this material is still liquid. Since the actual amount of heat absorbed is small despite the local melting it engenders, the layer must be locally separated from the substrate as the laser radiation leaves the region since the melt material will quickly solidify as heat flows to adjacent material which is lower in temperature. Thus, the film is progressively peeled as the laser radiation sweeps across the substrate under the layer.

The rapid solidification of the liquified material means that hot melt differing in material composition does not remain in contact with the layer in any given local region for a significant time interval. This minimizes the appearance of material derived from the substrate in the product film. The time during which significant heating of the layer occurs is very brief in any local region. Thus, diffusion effects are minimized. Impurity gradations established in the layer prior to the separation process can be maintained. This is advantageous in minimizing the cost of certain varieties of solar cells, for example, in that it is less costly to form the layer with a p-n junction, for example, than to form such a junction later in the manufacturing process after the film is separated from the substrate.

Limitations on product size are set by laser radiation requirements and the availability of substrates of the appropriate sizes.

It is possible to use laser radiation to heat the entire substrate surface simultaneously. This is less preferable in that the degrading effects on product quality of such an approach would be far more substantial as the total heat input and the time spent in contact with hot melt would each be far greater.

The process of absorption of radiation in a semiconductor material, for example, can be described in terms of parameters that permit comparison of various materials in a simple format. If F(x) is the photon flux per square centimeter per second, then the relationship:

$$F(x) = F(0) \exp(-\alpha_\lambda x)$$

is obeyed, where $\alpha_\lambda$ is the absorption coefficient for radiation of wavelength $\lambda$, and F(0) is the value of F(x) at the reference point x=0. The absorption coefficient can be represented graphically as a function of $\lambda$ and of photon energy for different materials.

Laser radiation of wavelength equal to 1.06 microns can be produced by a Nd:YAG continuous laser. The photon energy characteristic of such radiation is 1.17 eV. This radiation can be absorbed by semiconductor material with a band-gap energy less than 1.17 eV. A semiconductor material with a band-gap energy greater than 1.17 eV would be substantially transparent to such radiation.

The band-gap energy of the semiconductor InP is equal to 1.33 eV at 300° K. Thus, its absorption coefficient is essentially zero for 1.06 micron radiation. However, $Ga_xIn_{1-x}As_yP_{1-y}$ quaternary alloys can be lattice-matched to InP, and can be produced with band-gap energies spanning the range 0.75 ev to 1.3 eV. Such an alloy can be produced, therefore, which is an efficient absorber of 1.06 micron laser radiation. If an InP layer of crystal is formed on the surface of such an alloy with, e.g., a band-gap energy equal to 0.8 eV, then a laser can be used to separate the layer from the substrate as described previously. If the alloy absorption coefficient is $10^5$ cm$^{-1}$, then 71% of the photons incident on the surface of the alloy will be absorbed in a depth of 0.125 microns.

Further objects, features, and advantages of my invention will become apparent upon consideration of the following detailed description in conjunction with the drawing, in which:

FIG. 1 is a graphic representation of the relationship between absorption coefficient and radiation wavelength and photon energy for various semiconductor materials;

FIG. 2 is a schematic representation of a single-crystal layer being separated from a substrate using laser radiation transmitted through the layer;

FIG. 3 is a schematic representation of the system shown in FIG. 2, but where an intermediate layer of radiation-absorbant material is utilized;

FIG. 4 is a schematic representation of a thin layer of single-crystal being separated from a substrate using laser radiation transmitted through the substrate;

FIG. 5 is a schematic representation of a substrate with a single-crystal layer formed on it and with a metal foil pressed into contact with the layer; and FIG. 6 is a schematic representation of the crystal layer adhered to the metal foil as shown in FIG. 5 being separated from the substrate.

In FIG. 1, the relationship of the absorption coefficient with respect to radiation wavelength and photon energy is shown graphically for several different semiconductors. It should be noted that the indirect gap materials GaP and Si have a rate of increase in absorption coefficient with respect to the increase in photon energy which is less than that for the direct gap materials GaAs and CdS. Thus, for efficient adsorption of radiation propagating through these indirect gap materials, the radiation wavelength must be further from the fundamental absorption edge (longest wavelength) in the direction of shorter wavelength (greater photon energy) than is the case for the direct gap materials.

In pure state, these semiconductors are fairly transparent for wavelengths longer than that at their fundamental absorption edge. In impure state, they are opaque (they absorb) from the ultraviolet all the way up to radio wavelengths. In regions where pure materials absorb strongly, they have absorption coefficients of the order of $10^5$ cm$^{-1}$.

In FIG. 2, the numeral 3 denotes cylindrical substrate 5 on which a single-crystal thin-film layer 7 has been formed. Techniques for growing such a layer of crystal are well-known in the art and include, for example, vapor phase or liquid phase epitaxy or heteroepitaxy, growth from a melt, and molecular beam growth.

Laser 11 emits laser radiation 9, which is focused by optical system 13 into focus region 15 which extends the full length of the layer on the substrate. The amount of radiation in the focus region is sufficient to melt material in the focus region as the substrate rotates in direction 17. Initially, edge 19 of the layer is separated from the substrate. This can be accomplished by mechanically inserting a wedge when the underlying substrate has been liquified. This wedge is not shown, but any of conventional wedges suitable for the purpose may be used.

The initially-separated edge of the layer 19 may be mechanically held, and used to pull on the film in the direction 21 so that as the laser radiation sweeps along the substrate surface, the regions liquified may be freed of their overlying layer by pulling on the holding device. The mechanical holding device is not shown, but any conventional holding device may be employed for this purpose. This process is continued until the entire layer of crystal is separated from the substrate.

In the embodiment of the invention shown in FIG. 2, the layer of crystal is transparent to the laser radiation absorbed by the substrate. If the layer is InP, then the substrate can be composed of a $Ga_xIn_{1-x}As_yP_{1-y}$ alloy, for example, and used in conjunction with a Nd:YAG laser operating at 1.06 microns wavelength. In general, the alloy utilized should be tailored in terms of its composition to efficiently absorb the particular laser radiation which is used.

In FIG. 3, the arrangement shown in FIG. 2 is used, except that an intermediate layer of radiation-absorbant material 23 is formed between the crystal layer 7 and the cylindrical substrate 5. Liquification of this intermediate layer by means of absorption of the laser radiation allows the crystal layer 7 to be separated to become the thin-film product. In this case, it is preferable that the substrate 5 be transmissive of the laser radiation (since it is the intermediate layer which absorbs the radiation); this helps minimize local heating which would otherwise act to degrade the product. In this arrangement, the "intermediate" layer 23 actually functions as a substrate on which the crystal layer 7 is grown.

The embodiment shown in FIG. 3 is particularly useful when it is difficult to grow large single-crystals of a suitable radiation-absorbant material for use as a substrate in conjunction with the desired thin-film product material. For example, it is much easier to grow large single-crystals of pure silicon than it is to grow large single-crystals of silicon-germanium alloys with a mol percent silicon in the range 15% to 95%. When a silicon thin-film product is required, therefore, the arrangement of FIG. 3 is preferably employed, and an intermediate layer of silicon-germanium alloy is used in conjunction with a silicon substrate. The layer can be grown in a thickness of 0.5 microns, and the silicon crystal layer can be grown to a thickness of 25 microns. Such a thickness of silicon is sufficiently flexible to be easily handled yet is sufficiently thick that it can be used to manufacture an efficient p-n junction solar cell.

In FIG. 4, substrate 25 has a layer of crystal 27 formed on it. In this embodiment of the invention, the substrate is transparent to the laser (or other) radiation 29 which is transmitted through it by optical system 31 into focus region 33. As local liquification in the focus region develops due to absorption of sufficient laser radiation, wedge 35 is advanced by mechanical means (these means are not shown, but conventional means may be used for this purpose) in direction 37 so as to separate the layer of crystal from the substrate at the liquified material. Simultaneously, the optical system and the laser radiation are swept across the layer in direction 39 so that the entire layer can be progressively separated from the substrate to become a thin-film product. The liquified material will tend to solidify with a crystal structure that is a continuation of the crystal structure of the underlying layer of crystal. While liquid, it can be mechanically or chemically removed, however. After solidification, if the crystal structure is unsatisfactory, it may be recrystallized for example, by sweeping laser radiation over it to produce superficial melting, or it can be removed by chemical or mechanical means.

In FIG. 5, substrate 43 is shown with a thin single-crystal layer 45 formed on it. A metal foil 47 is pressed into contact with the layer by support 49. This assembly is brought to a temperature and held there for a time such that a eutectic alloy of the material of the layer and the foil forms in the contact region of the two, in order to establish good mechanical adherence and electrical contact between them. The art of forming a eutectic alloy between a semiconductor material and a metal, for example, is well known in the art of semiconductor electronics manufacture. Aluminum and silicon form such a eutectic alloy at 577° centigrade, for example.

In FIG. 6, separation of the foil 47 with the adhering layer of crystal 45 is accomplished by focusing laser radiation 55 through optical system 53 into focus region 51, where local melting of material of the layer of crystal results from absorption of laser radiation. As such melting occurs, the foil with the adhering crystal is separated from the substrate 43. Any conventional means may be employed for pulling on the foil to achieve such separation. To separate the entire foil with its adhering crystal, the laser radiation is swept across the entire layer of crystal by moving substrate 43 at a suitable speed in direction 57. Because only a very small amount of heat is developed to effect separation, metal atoms from the foil will not dissolve into the crystal layer and degrade its characteristics, unlike the situation which would result were gross heating employed to effect separation as in the prior art.

The liquified material will tend to solidify with a crystal structure that is a continuation of that of the underlying solid. If that is not satisfactorily accomplished, it can be removed or treated to produce a more satisfactory crystal structure, as previously described.

Although the invention has been described with reference to particular embodiments, it is to be understood that these embodiments are merely illustrative of the application of the principles of my invention. The basic concept of the invention is to provide a crystal layer which will become the product, grown on a material of different composition (called the substrate), with the two materials having different absorptive characteristics to the radiation employed to effect separation. The direction of the impinging radiation, as well as which of the two materials absorbs it, are not critical as long as the radiation passes through one of the materials and is absorbed by the other at their interface. The techniques of the invention can be used to obtain both single-crystal and polycrystalline products. Thus it is to be understood than numerous modifications may be made in the illustrative embodiments of the invention and other arrangements may be devised without departing from the spirit and scope of the invention.

What I claim is:

1. A method of producing thin crystals comprising the steps of epitaxially growing an attached layer of crystal on a substrate, said layer of crystal being transparent to radiation of at least one particular wavelength to which said substrate is absorptive in a region of said substrate adjacent the interface of said substrate with said layer of crystal, directing radiation of said at least one particular wavelength into at least part of said absorptive region through said layer of crystal such that material of said at least part but not all of said absorptive region liquifies at the interface of said layer of crystal and substrate, and separating said layer of crystal from said substrate at the liquified material.

2. A method in accordance with claim 1 wherein said radiation is laser radiation.

3. A method in accordance with claim 1 wherein said layer of crystal is grown with a single-crystal structure.

4. A method in accordance with claim 3 wherein said radiation is laser radiation.

5. A method of producing thin crystals comprising the steps of epitaxially growing an attached layer of crystal on a substrate, said layer of crystal being absorptive of radiation of at least one particular wavelength to which said substrate is transmissive in a region of said layer of crystal at the interface of said layer of crystal with said substrate, directing radiation of said at least one particular wavelength into at least part of said absorptive region through said substrate such that material of said at least part but not all of said absorptive region liquifies at the interface of said layer of crystal and substrate, and separating said layer of crystal from said substrate where said liquified material is present.

6. A method in accordance with claim 5 wherein said radiation is laser radiation.

7. A method in accordance with claim 5 wherein said layer of crystal is grown with a single-crystal structure.

8. A method in accordance with claim 7 wherein said radiation is laser radiation.

9. A method of producing thin crystals comprising the steps of epitaxially growing an attached layer of crystal on a substrate, said layer of crystal being absorptive of radiation to which said substrate is transmissive in at least part of said layer of crystal, adhering a metal foil to said layer of crystal, directing said radiation into said at least part of said layer of crystal through said substrate such that material of said at least part but not all of said layer of crystal liquifies to form a liquid at the interface of said layer of crystal and substrate, and separating said layer of crystal adhered to said metal foil from said substrate at the liquified material.

10. A method in accordance with claim 9 wherein said radiation is laser radiation.

11. A method in accordance with claim 9 wherein said layer of crystal is grown with a single-crystal structure.

12. A method in accordance with claim 11 wherein said radiation is laser radiation.

13. A method of producing thin crystals comprising the steps of epitaxially growing an attached layer of crystal on a substrate, one of said layer of crystal and said substrate being transparent to radiation of at least one particular wavelength to which the other of said layer of crystal and said substrate is absorptive in a region at the interface of said substrate and said layer of crystal, directing radiation of said at least one particular wavelength into at least part of the absorptive one of said layer of crystal and said substrate through the other such that absorptive material liquifies only at the interface of said layer of crystal and substrate, and separating said layer of crystal from said substrate at the liquified material.

14. A method in accordance with claim 13 wherein said radiation of said at least one particular wavelength is transmitted through the transparent one of said layer of crystal and said substrate on its way to the absorptive one of said layer of crystal and said substrate.

15. A method in accordance with claim 14 wherein said radiation is swept across said interface and said layer of crystal is separated in the region of said interface which has been irradiated.

16. A method in accordance with claim 15 wherein said radiation is laser radiation.

17. A method in accordance with claim 16 wherein said layer of crystal is grown with a single-crystal structure.

18. A method in accordance with claim 14 further including the step of adhering a sheet of material to said layer of crystal prior to the separation thereof from said substrate.

19. A method in accordance with claim 18 wherein said sheet of material is pulled to effect separation of said layer of crystal from said substrate.

* * * * *